United States Patent
Ren et al.

(10) Patent No.: US 7,986,533 B2
(45) Date of Patent: Jul. 26, 2011

(54) SHIELDING ASSEMBLY AND ELECTRONIC DEVICE UTILIZING THE SAME

(75) Inventors: Wen-Jia Ren, Shenzhen (CN); Xiao-Yan Qin, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 116 days.

(21) Appl. No.: 12/437,524

(22) Filed: May 7, 2009

(65) Prior Publication Data

US 2010/0149780 A1    Jun. 17, 2010

(30) Foreign Application Priority Data

Dec. 12, 2008  (CN) .................. 2008 2 0303363 U

(51) Int. Cl.
*H05K 9/00*  (2006.01)

(52) U.S. Cl. ........ 361/818; 361/800; 361/816; 174/350; 174/372; 174/377

(58) Field of Classification Search .................. 361/818, 361/816, 800, 799, 753; 174/372, 387, 350, 174/559, 561
See application file for complete search history.

(56) References Cited

U.S. PATENT DOCUMENTS

| | | | | |
|---|---|---|---|---|
| 3,721,746 | A * | 3/1973 | Knappenberger | 174/372 |
| 3,816,911 | A * | 6/1974 | Knappenberger | 29/841 |
| 4,370,515 | A * | 1/1983 | Donaldson | 174/387 |
| 5,844,784 | A * | 12/1998 | Moran et al. | 361/818 |
| 5,895,884 | A * | 4/1999 | Davidson | 174/372 |
| 6,043,992 | A * | 3/2000 | Scheibler | 361/818 |
| 6,121,546 | A | 9/2000 | Erickson et al. | |
| 6,180,876 | B1 * | 1/2001 | Holmes | 174/367 |
| 6,600,663 | B1 * | 7/2003 | Koleda | 361/816 |
| 7,488,902 | B2 * | 2/2009 | English et al. | 174/382 |
| 7,663,895 | B2 * | 2/2010 | Huang | 361/818 |
| 2009/0273912 | A1 * | 11/2009 | Myers et al. | 361/818 |

* cited by examiner

*Primary Examiner* — Dameon E Levi
(74) *Attorney, Agent, or Firm* — Raymond J. Chew

(57) ABSTRACT

A shielding assembly comprises at least two shielding modules, each comprising a frame and a cover mounted on the frame. Each of the at least two covers comprises a plurality of engaging portions and a plurality of slots between each two adjacent engaging portions, and one portion of one of the at least two frames abuts one portion of another of the at least two frames. Each of the plurality of engaging portions of one of the at least two covers is received in a corresponding slot of another of the at least two covers to connect the at least two shielding covers to form a cover to reduce electromagnetic interference for an electronic components positioned on a circuit board.

11 Claims, 3 Drawing Sheets

SHIELDING ASSEMBLY AND ELECTRONIC DEVICE UTILIZING THE SAME

BACKGROUND

1. Technical Field

The disclosure generally relates to electronic devices, and more particularly to an electronic device with a shielding assembly.

2. Description of Related Art

Shielding assemblies often protect electronic components on a circuit board of an electronic device from electromagnetic interference (EMI). If the electronic component is large, dimensions of the shielding assembly are commensurately large. However, when the electronic component dimensions exceed 45*45 mm$^2$, the shielding assembly cannot meet planar requirements for surface mounted (SMT) process of less than 0.1 mm, such that the shielding assembly cannot be firmly mounted on the circuit board.

Therefore, a need exists in the industry to overcome the described limitations.

DETAILED DESCRIPTION

Figure 1:
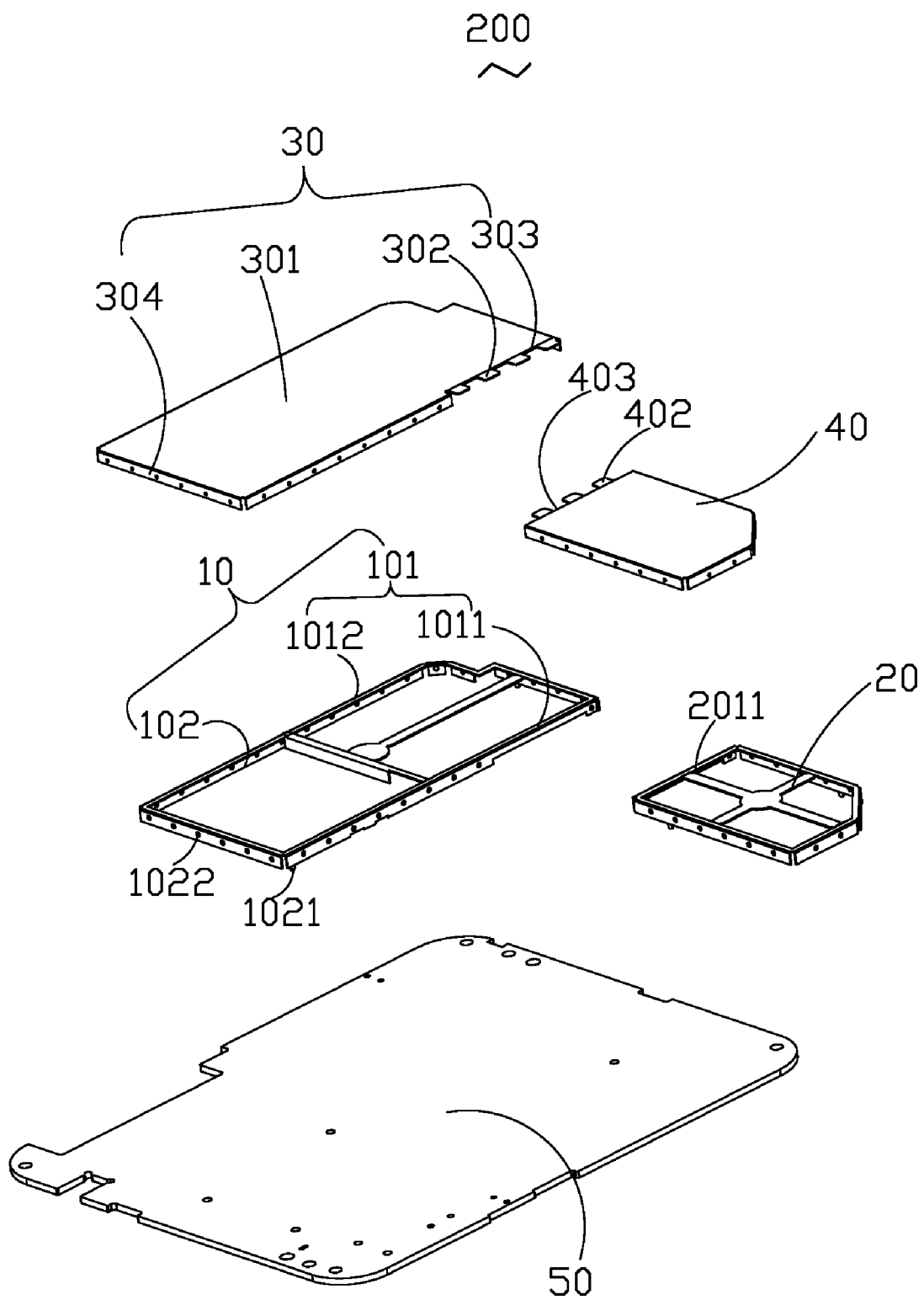
FIG. 1 is an exploded, isometric perspective view of an electronic device of the disclosure.
Figure 2:
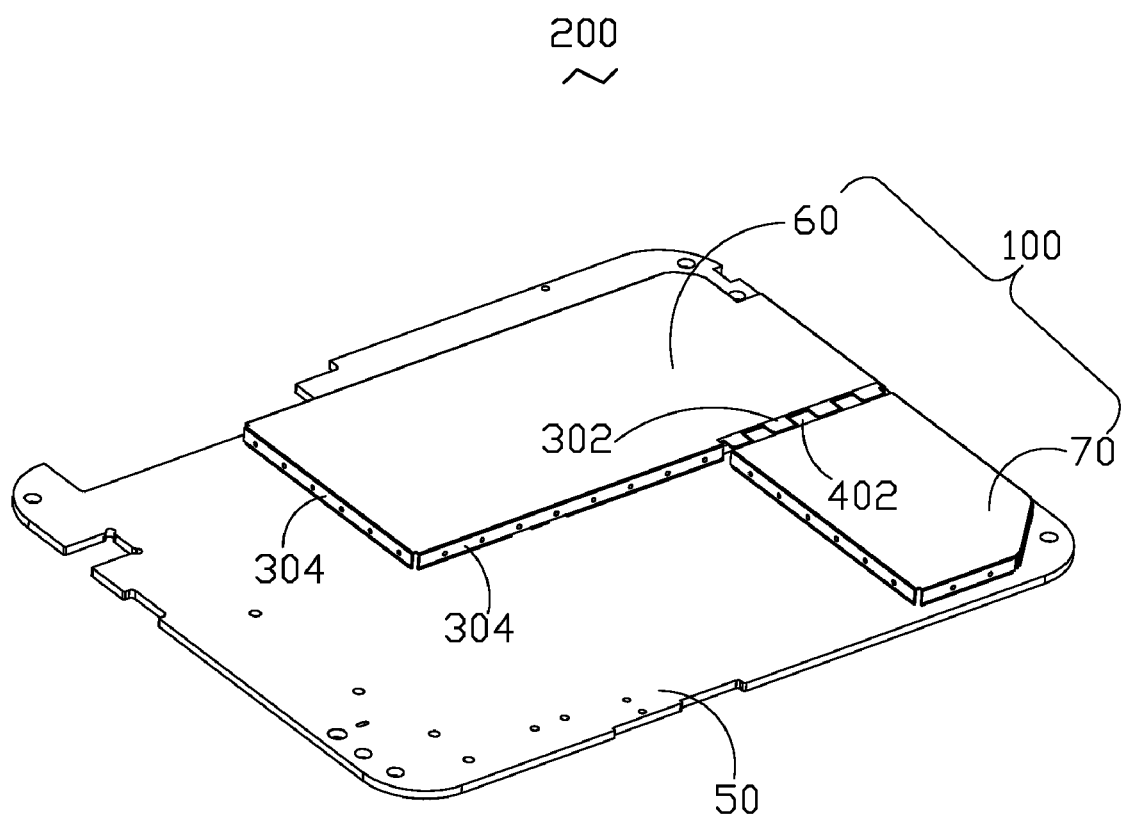
FIG. 2 is an assembled view of FIG. 1.

FIG. 1 shows an exploded, isometric perspective view of an electronic device 200 of the disclosure. FIG. 2 is an assembled view of the electronic device 200. The electronic device 200 includes a shielding assembly 100 and a circuit board 50.

The shielding assembly 100 is soldered to the circuit board 50 to provide protection against electromagnetic interference (EMI) for an electronic component positioned on the circuit board 50, in one example. The shielding assembly 100 comprises at least two shielding modules. In the illustrated embodiment, the shielding assembly 100 comprises a first shielding module 60 including a first shielding frame 10 soldered to the circuit board 50 and a first shielding cover 30 mounted on the first shielding frame 10, and a second shielding module 70 including a second shielding frame 20 soldered to the circuit board 50 and a second shielding cover 40 mounted on the second shielding frame 20.

The first shielding frame 10 comprises a frame body 101 including a first portion 1011, a second portion 1012, and a plurality of first sidewalls 102 extending from the second portion 1012 toward the circuit board 50 and soldered to the circuit board 50. Each of the plurality of first sidewalls 102 defines a plurality of grooves 1022 in an exterior surface of each of first sidewalls 102. The first sidewalls 102 include at least one mounting portion 1021 extending downward from one of the plurality of first sidewalls 102 and received in a hole (not labeled) of the circuit board 50 to fix the first shielding frame 10 thereto.

The first shielding cover 30 comprises a cover body 301, a plurality of first engaging portions 302, a plurality of first slots 303 between each two adjacent first engaging portions 302, and a plurality of second sidewalls 304 extending downward from portions of the cover body 301 and corresponding to the plurality of first sidewalls 102 of the shielding frame 10.

Figure 3:
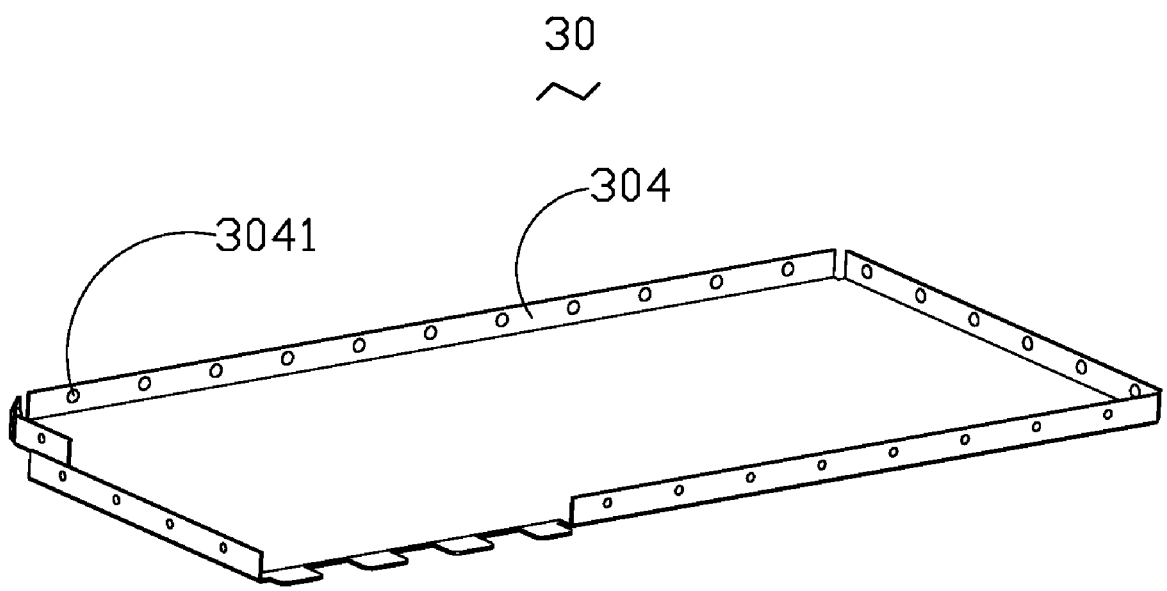
FIG. 3 is an inverted view of a shielding assembly as disclosed, applicable with an electronic device such as, for example, that of FIG. 1.

Each of the plurality of second sidewalls 304 includes a plurality of projections 3041 (referring to FIG. 3) projecting an interior surface of each of the plurality of second sidewalls 304 and received in corresponding grooves 1022 of the shielding frame 10 to attach the first shielding cover 30 to the first shielding frame 10. The plurality of first engaging portions 302 and the plurality of first slots 303 are positioned on other portions of the cover body 301 other than the portions from where the second sidewalls 304 extending and are coplanar with the cover body 301.

The second shielding frame 20 and the second shielding cover 40 of the shielding module 70 have the same configuration and can substantially perform the same function as the first shielding frame 10 and the first shielding cover 30 of the shielding module 60, differing only in that dimensions of the first shielding module 60 are not equal to those of the second shielding module 70. The second shielding cover 40 includes a plurality of second engaging portions 402 received in the first slots 303 of the first shielding cover 30 and a plurality of second slots 403 to receive the first engaging portions 302 of the first shielding cover 30 to engage the first shielding cover 30 with the second shielding cover 40.

In the illustrated embodiment, the dimensions of each of the shielding frames 10, 20 are less than 45*45 mm$^2$.

In assembly, the first shielding frame 10 of the first shielding module 60 and the second shielding frame 20 of the second shielding module 70 are soldered to the circuit board 50 with first portion 1011 of the first shielding frame 10 abutting a third portion 2011 of the second shielding frame 20. The first shielding cover 30 of the first shielding module 60 and the second shielding cover 40 of the second shielding module 70 are mounted on the first shielding frame 10 and the second shielding frame 20, respectively, with the first engaging portions 302 of the first cover 30 received in the second slot 403 of the second cover 40 and the second engaging portion 402 received in the first slots 303 of the first cover 30 to form an a cover to reduce EMI for the electronic component. In this position, the first shielding module 60 and the second shielding module 70 are assembled into the shielding assembly to protect the electronic component on the circuit board 50 from EMI. In other words, the large shielding assembly is divided into two or more small shielding modules 60, 70, each with smaller dimensions, thereby complying with planar requirements for surface mount technology (SMT) process.

Alternatively, the shielding assembly 100 can include three or more shielding modules while remaining well within the scope of the disclosure.

While an exemplary embodiment has been described, it should be understood that it has been presented by way of example only and not by way of limitation. The breadth and scope of the disclosure should not be limited by the described exemplary embodiments, but only in accordance with the following claims and their equivalents.

What is claimed is:

1. A shielding assembly for electronic components positioned on a circuit board, the shielding assembly comprising:

at least two shielding modules, each comprising a shielding frame and a shielding cover mounted on the shielding frame, wherein each of the at least two shielding covers comprises a plurality of engaging portions and a plurality of slots between each two adjacent engaging portions;

wherein a portion of one of the at least two shielding frames abuts that of another of the at least two shielding frames;

wherein each of the engaging portions of one of the at least two shielding covers is received in a corresponding slot of another of the at least two shielding covers to connect the at least two shielding covers to form a cover to reduce electromagnetic interference for the electronic components.

2. The shielding assembly as claimed in claim 1, wherein each of the at least two shielding frames comprises a frame body comprising a first portion, a second portion, and a plurality of first sidewalls, the first portion of one shielding frame abutting that of another shielding frame, and the plurality of first sidewalls extending downward from the second portion of the shielding frame body and soldered to the circuit board.

3. The shielding assembly as claimed in claim 2, wherein each of the plurality of first sidewalls defines a plurality of grooves in an exterior surface thereof.

4. The shielding assembly as claimed in claim 3, wherein each of the at least two shielding covers comprises a cover body and a plurality of second sidewalls extending downward from other portions than the engaging portions of the cover body and corresponding to the plurality of first sidewalls.

5. The shielding assembly as claimed in claim 4, wherein each of the plurality of second sidewalls comprises a plurality of projections projecting an interior surface of each of the plurality of second sidewalls and received in the plurality of grooves to attach the shielding cover to the shielding frame.

6. An electronic device, comprising:
a circuit board comprising an electronic component; and
a shielding assembly mounted on the circuit board to protect the electronic component from electromagnetic interference, the shielding assembly comprising at least two shielding modules, each comprising a shielding frame and a shielding cover mounted on the shielding frame, wherein each of the at least two shielding covers comprising a plurality of engaging portions and a plurality of slots between each two adjacent engaging portions, and wherein a portion of one of the at least two shielding frames abuts that of another one of the at least two shielding frames;
wherein each of the plurality of engaging portions of one of the at least two shielding covers is received in a corresponding slot of another of the at least two shielding covers to connect the at least two shielding covers to form a cover to reduce electromagnetic interference for the electronic component.

7. The electronic device as claimed in claim 6, wherein each of the at least two shielding frames comprises a frame body comprising a first portion, a second portion, and a plurality of first sidewalls, the first portion of one shielding frame abutting that of another shielding frame and the plurality of first sidewalls extending from the second portion of the frame body toward the circuit board and soldered to the circuit board.

8. The electronic device as claimed in claim 7, wherein each of the plurality of first sidewalls defines a plurality of grooves in an exterior surface thereof.

9. The electronic device as claimed in claim 8, wherein each of the at least two shielding covers comprises a cover body and a plurality of second sidewalls extending downward from other portions than the engaging portions of the cover body and corresponding to the plurality of first sidewalls.

10. The electronic device as claimed in claim 9, wherein each of the plurality of second sidewalls comprises a plurality of projections projecting an interior surface of each of the plurality of second sidewalls and received in the plurality of grooves to attach the shielding cover to the shielding frame.

11. A shielding assembly for shielding electronic components on a circuit board, the shielding assembly comprising:
at least two shielding frames each comprising a frame body, a portion of the frame body of one of the shielding frames abutting that of another one of the shielding frames, one or more first sidewalls extending from remaining portion other than the abutting portion of each of the shielding frames toward the circuit board; and
at least two shielding covers correspondingly covering the at least two shielding frames, each shielding cover comprising a cover body, portions of the covers corresponding to the abutting portions of the shielding frames comprising a plurality of engaging portions and a plurality of slots defined between each two adjacent engaging portions, other portions of the shielding covers corresponding to the remaining portion other than the abutting portions of the frames comprising one or more second sidewalls correspondingly overlapping the first sidewalls of the shielding frames;
wherein each of the engaging portions of one of the shielding covers is received in one corresponding slot of another one of the shielding covers to collectively form a cover to reduce electromagnetic interference for the electronic components.

* * * * *